United States Patent [19]
Kajola et al.

[11] Patent Number: 5,289,121
[45] Date of Patent: Feb. 22, 1994

[54] COMPOSITE PICKUP COIL FOR MEASUREMENT OF MAGNETIC FIELD COMPONENTS IN A SUPERCONDUCTING QUANTUM INTERFERENCE DEVICE

[75] Inventors: Matti J. Kajola; Jukka E. T. Knuutila, Helsinki, both of Finland

[73] Assignee: Neuromag Oy, Finland

[21] Appl. No.: 807,035

[22] Filed: Dec. 13, 1991

[30] Foreign Application Priority Data

Dec. 21, 1990 [FI]  Finland ................................. 906341

[51] Int. Cl.$^5$ ............................................. G01R 33/02
[52] U.S. Cl. .................................... 324/248; 336/232; 505/846
[58] Field of Search ................ 324/248, 244; 336/200, 336/232; 505/845, 846

[56] References Cited
U.S. PATENT DOCUMENTS
4,320,341  3/1982  Lutes .

FOREIGN PATENT DOCUMENTS
399499  5/1985  European Pat. Off. .
210489  7/1985  European Pat. Off. .

OTHER PUBLICATIONS
T. Ryhänen et al, "SQUID Magnetometers for Low-Frequency Applications", Journal of Low Temperature Physics, vol. 76 (Sep. 1989), pp. 287-386.
J. Knuutila et al, "Design Considerations for Multichannel SQUID Magnetometers", Superconducting Quantum Interference Devices and Their Applications SQUID '85, 1985, pp. 939-944 (no month).
M. Kajola et al, "A 24-Channel Magnetometer for Brain Research", Advances in Biomagnetism, 1990, pp. 673-676 (no month).
M. B. Ketchen, "Design of Improved Integrated Thin--Film Planar dc SQUID Gradiometers", Journal of App. Physics, vol 58 (Dec. 1985), pp. 4322-4325.
J. E. Zimmerman, "Sensitivity Enhancement of Superconducting Quantum Interference Devices . . . ", Journ. of App. Physics, vol 42, pp. 4483-4487 (Oct. 1971).
D. Drung et al, "Low-Noise High-Speed Dc Superconducting Quantum Interference Device Magnetometer with Simplified Feedback Electronics", Applied Physics Letters, vol 57, pp. 406-408 (Jul. 1990).

*Primary Examiner*—Walter E. Snow
*Attorney, Agent, or Firm*—Andrus, Sceales, Starke & Sawall

[57] ABSTRACT

The invention concerns a pickup coil to measure components of gradients. The coil consists of two pairs of loops connected in series; these pairs are then connected in parallel. The coil so formed has a low inductance, and no shielding currents are induced to superconducting coils in homogeneous magnetic fields. One coil can be employed to measure several field components simultaneously when the coil is coupled to current sensing elements, for example to SQUIDS, so that the current components measured by the sensing elements do not couple magnetically because of the symmetry. This can be accomplished by connecting the said elements between terminals between the loops (5, 6 and 7, 8). The inductance of this coil can be further reduced by subdividing the loops into parts connected in parallel.

21 Claims, 5 Drawing Sheets

COMPOSITE PICKUP COIL FOR MEASUREMENT OF MAGNETIC FIELD COMPONENTS IN A SUPERCONDUCTING QUANTUM INTERFERENCE DEVICE

REFERENCES CITED

U.S. Pat. No. 4,320,341 Jan. 17, 1982 Lutes
EP 210 489 Jul. 22, 1985 Hoenig
EP 399 499 May 25, 1985 Yokosawa and Nakane
T. Ryhänen, H. Seppä, R. Ilmoniemi, and J. Knuutila, "SQUID Magnetometers for Low-Frequency Applications", *Journal of Low Temperature Physics*, volume 76 (1989), issue 5/6, pp. 287–386.
J. Knuutila, A. I. Ahonen, M. S. Hämäläinen, R. J. Ilmoniemi, and M. J. Kajola, "Design Considerations for Multichannel SQUID Magnetometers", *Superconducting Quantum Interference Devices and Their Applications SQUID'85*, de Gruyter, Berlin 1985, pp. 939–944.
M. Kajola, S. Ahlfors, G. J. Ehnholm, J. Hällström, M. S. Hämäläinen, R. J. Ilmoniemi, M. Kiviranta, J. Knuutila, O. V. Lounasmaa, C. D. Tesche, and V. Vilkman, "A 24-Channel Magnetometer for Brain Research", in: *Advances in Biomagnetism*, eds. S. J. Williamson, M. Hoke, G. Stroink, and M. Kotani. (Plenum Press, New York, 1990), pp. 673–676.
M. B. Ketchen, "Design of Improved Integrated Thin-Film Planar Dc SQUID Gradiometers", *Journal of Applied Physics* volume 58 (1985), issue 11, pp. 4322–4325.
J. E. Zimmerman, "Sensitivity Enhancement of Superconducting Quantum Interference Devices through the Use of Fractional-Turn Loops", *Journal of Applied Physics*, volume 42 (1971), issue 11, pp. 4483–4487.
D. Drung, R. Cantor, M. Peters, H. J. Scheer, and H. Koch, "Low-Noise High-Speed Dc Superconducting Quantum Interference Device Magnetometer with Simplified Feedback Electronics", *Applied Physics Letters* vol. 57 (1990), issue 4, pp. 406–408.

BACKGROUND OF THE INVENTION

1. Field of the Invention

This invention describes a single coil that can be used to measure simultaneously two components of the magnetic field or two components of the gradient of the field; in particular, we describe a coil, primarily intended for measurement of one component of the gradient, having several attractive properties and that is easily modified to measure two independent gradient components simultaneously.

Weak magnetic fields are often measured by placing a pickup coil to the field to be measured, and connecting it to a current sensing element. When ultimate sensitivity is required, the coil is most often made of superconducting material, and it is connected to a superconducting quantum interference device (SQUID). Such an instrument has been described in detail, for example, in an article appeared in *Journal of Low Temperature Physics*, vol. 76 (1989), issue 5/6, pp. 287–386. The pickup coil can be either coupled to a signal coil laid on top of the SQUID, thus coupling the signal magnetically to the SQUID, or the pickup coil can be a galvanically coupled part of the SQUID loop. It has been shown that in order to reach the best sensitivity, the inductance of the SQUID has to be very small, only of the order of $10^{-11}$ H, and that stray capacitances across the loop have to be minimized.

An optimal pickup coil has, in general, an equal impedance to that of the input of the measuring element. When a SQUID is used to measure the current flowing in the pickup coil, it is advisable to use a pickup coil with a small inductance. Then, the signal coil laid on top of the SQUID can have only a small number of turns and thus a small parasitic capacitance across the SQUID loop; this means better sensitivity. This follows from the fact that the inductance of the signal coil, that is the input inductance of the current sensing element, is directly proportional to the product of the square of the number of turns in the signal coil and the inductance of the SQUID loop. The requirement that the inductance of the SQUID loop should be as small as possible makes it difficult to use the pickup coil as a galvanically coupled part of the SQUID.

2. Description of the Related Art

Ultrasensitive magnetic field detectors are needed, for example, when the extremely weak magnetic signals generated by the human brain are measured. In medical research and diagnostics this method is gaining more and more attention since with it it is possible to locate the source currents associated with the brain activities with a spatial and temporal resolution of a few millimeters and milliseconds. The measurement must be performed simultaneously at several locations; even the measurement of over one hundred magnetic signals all over the skull is necessary. It has been shown that it is advantageous to measure, instead of the magnetic field itself, certain components of the gradient of the field; especially this applies to the planar gradients $\partial B_z/\partial x$ and $\partial B_z/\partial y$ (see, for example, *SQUID'85: Superconducting Quantum Interference Devices and their Applications*, edited by H. D. Hahlbohm and H. Lübbig, Walter de Gruyter, Berlin (1985), pp. 939–944. One such instrument, containing 24 channels, has been described in the book *Advances in Biomagnetism*, edited by S. J. Williamson, M. Hoke, G. Stroink and M. Kotani, Plenum, New York (1989), pp. 673–676.

FIG. 1 shows two different two different prior-art coil configurations measuring the planar gradient: the parallel (a) and the series (b) configuration. The series configuration has been more popular (see, for example U.S. Pat. No. 4,320,341, EP 210 489, EP 399 499). This mainly because in the parallel configuration, a shielding current is induced in a homogeneous field, tending to cancel the homogeneous field; in the series coil this current is absent. Especially in thin-film pickup coils it is possible that the shielding current exceeds the critical current of the film, and the film becomes non-superconducting. In addition, the shielding currents due to a homogeneous field causes a local inhomogeneous component; in multichannel magnetometers this unwanted gradient is coupled as an error signal to neighbor pickup coils. The parallel configuration has, however, a much smaller inductance, only ¼ of that of a series coil of the same dimensions. Therefore, parallel connection of loops has been used in devices where the pickup coil is a galvanically coupled part of the actual SQUID loop, as for example in the article appeared in *Journal of Applied Physics*, vol. 58 (1985), n:o 11, ss. 4322–4325. Parallel loops have been applied also to reduce the inductance of the SQUID, as in *Journal of Applied Physics*, volume 42 (1971), issue 11, pp. 4483–4487 and *Applied Physics Letters*, volume 57 issue 4 (1990), pp. 406–408.

The transverse, planar gradient components must be measured in one single point; thus one must fabricate a structure having two orthogonal gradiometers on top of each other. Such a structure, realized by conventional means, as described in aforementioned publications (U.S. Pat. No. 4,320,341, EP 210 489, *SQUID'85: Superconducting Quantum Interference Devices and their Applications*, (1985), ss. 939-944) is necessarily relatively complicated.

SUMMARY OF THE INVENTION

With the present invention, a substantial improvement to the prior art is gained.

This novel structure has the property and advantage that two orthogonal gradients can be measured simultaneously with a single coil. A simpler structure thus results. The structure is based on the fact that two current sensing elements can be connected to the coil so that the current components measured by them do not couple magnetically because of the symmetry properties of the pickup coil, even though the currents flow galvanically in the same conductor.

The coil described in this invention is planar, and it measures the gradient parallel to the coil of the magnetic field component perpendicular to the plane of the coil. The coil comprises two loop pairs connected in parallel; the individual loops in each loop pair are coupled in series. It also combines both properties desirable for a pickup coil: no shielding current is generated in a homogeneous field, and the inductance of the coil is almost equal to that of the traditional parallel configuration depicted in FIG. 1a. The coil cannot be constructed simply by straight forward connection of parallel loops only or serial loops only, as has been applied in all of the aforementioned references. It is essential to combine the series and parallel connections of the coils, acting in opposite directions, so that the shielding currents in a homogeneous field are avoided. The coil is not similar to the well-known coil measuring the quadrupolar component of the field, although it might at first sight resemble it. The coil described in this invention measures the first-order gradient; the quadrupolar coil, in turn, is insensitive to that component.

DETAILED DESCRIPTION

Figure 3:
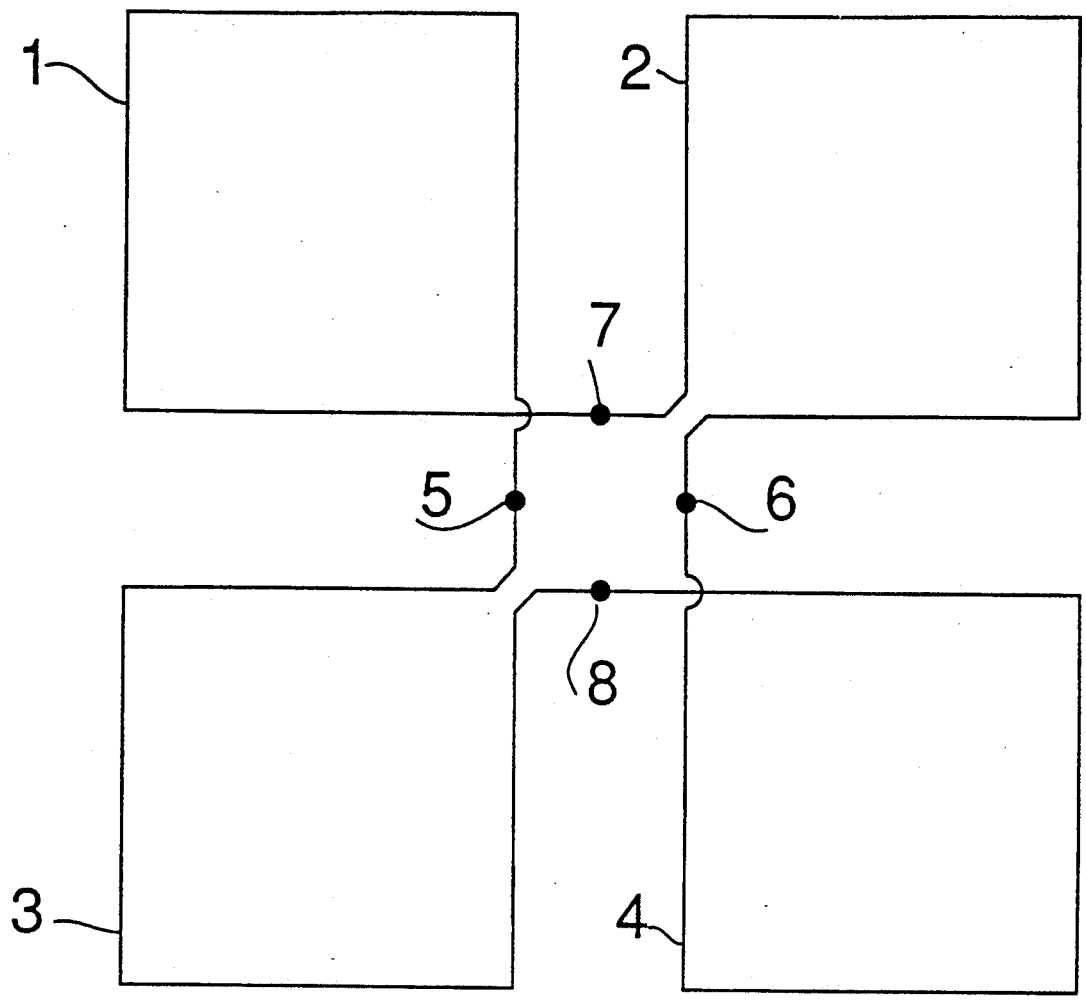
FIG. 3 shows how the coil can be used to measure two orthogonal planar gradient components.
Figure 4:
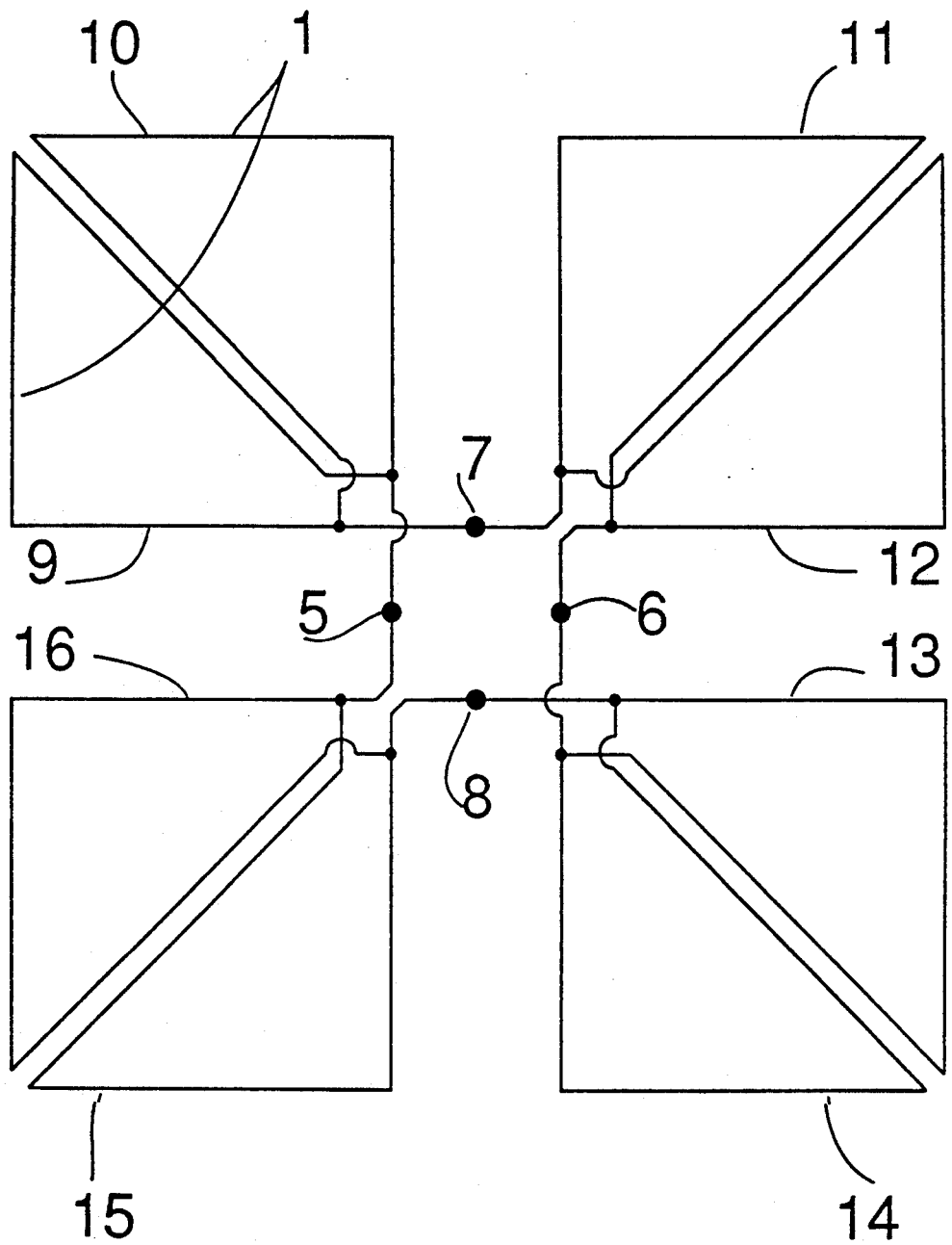
FIG. 4 shows how the inductance can be reduced further by an extra parallel connection. Finally

In the following, a preferred embodiment of the invention is presented, with reference to FIGS. 2-4.

Figure 1:
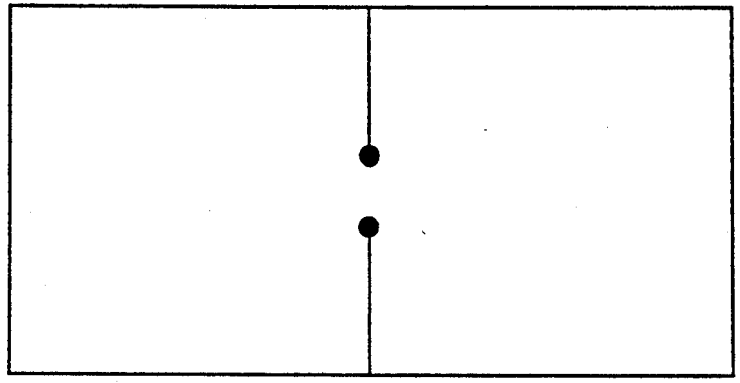
FIG. 1 shows schematically two prior-art ways of constructing planar gradiometers.
Figure 1:
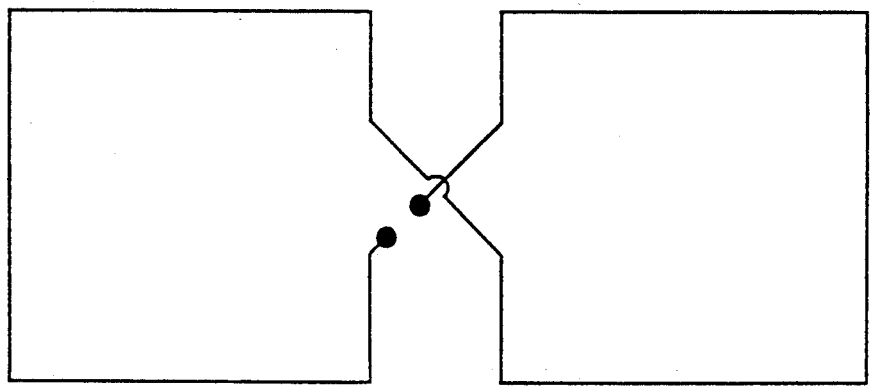
Figure 2:
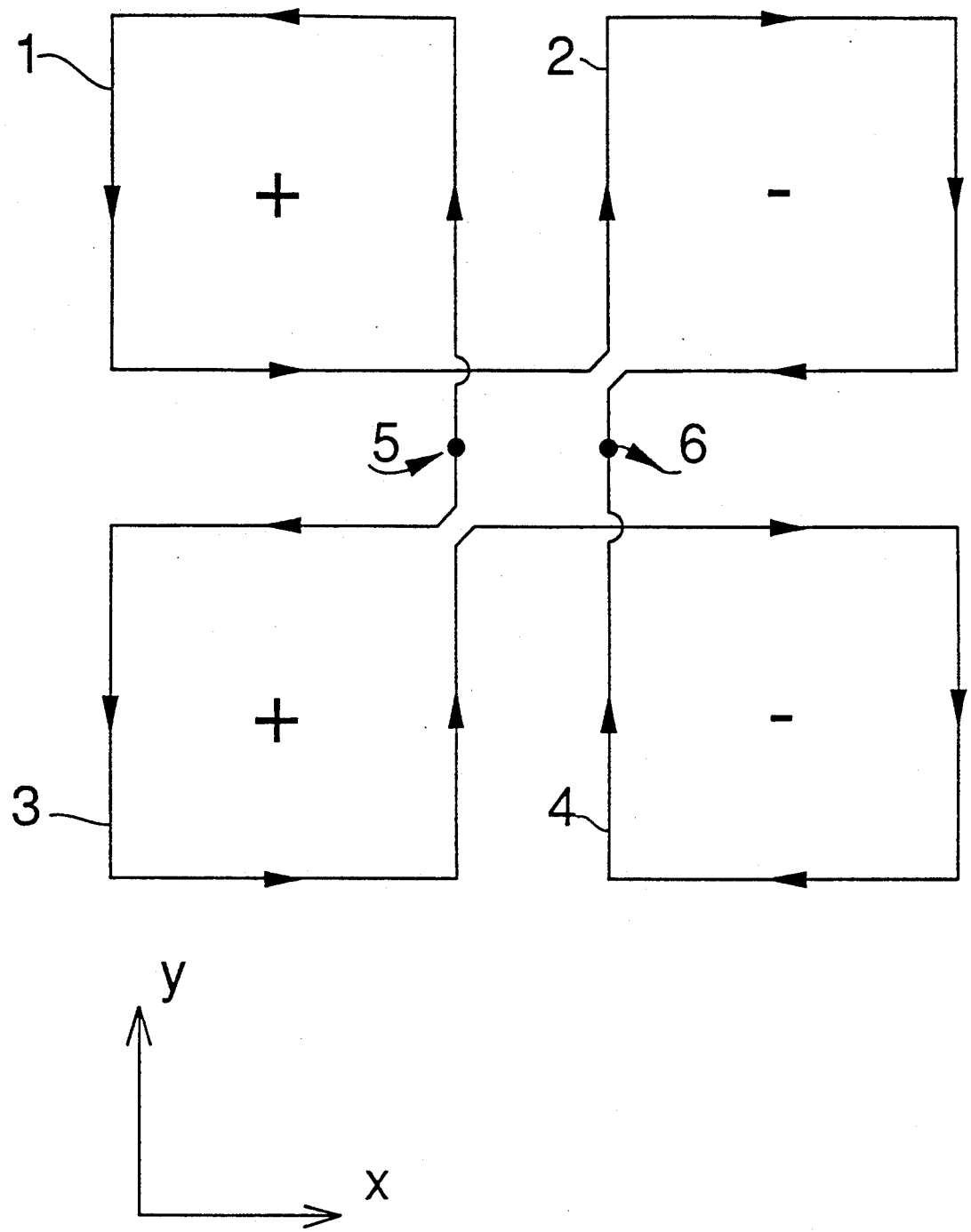
FIG. 2 depicts the connection of the coils.

FIG. 2 shows the structure of the coil described in this invention. The terminals of the coil are denoted by (5) and (6). Terminals (5) and (6) are connected to a current sensing element 21. The loops (1) and (2) have been connected in series, as well as loops (3) and (4). The two figure-of eight coils (1, 2 ; 3, 4) are then connected in parallel. In FIG. 2 we have indicated the direction of the current induced by a magnetic field gradient in the x-direction and the polarity of the sensitivity of each loop. FIG. 3 shows how the coil can be employed in measuring two mutually orthogonal gradients by means of extra terminals (7) and (8). A current sensing element (21) connected to terminals (5) and (6) detects gradients in the x-direction, and another current sensing element (22) between terminals (7) and (8) detects gradients in the y-direction. If the loops are symmetrical, a gradient in the x-direction does not induce a current to a sensing element between terminals (7) and (8). Conversely, a gradient in the y-direction does not induce a current between terminals (5) and (6); thus, the two components of the gradient can be measured using only one pickup coil.

The inductance of the coil can be reduced further by dividing each of the four loops (1, 2, 3, 4) to several subloops connected in parallel. FIG. 4 shows a way to subdivide the loops in two parts (9, 10; 11, 12; 13, 14; 15, 16) so that all loops are mutually in an equivalent position and that the current in the subloops is divided equally between the halves. The four main loops (1, 2, 3, 4) can be subdivided further in smaller parts connected in parallel, since no shielding current is induced in the homogeneous field because of the symmetry of the coil.

In the coils described above, an inductively coupled SQUID can be employed as the current sensing element (21) and/or (22). See FIG. 2. The coil can also be a galvanically connected part of the loop of the superconducting quantum interference device; (See FIG. 3) then, the current sensing elements are replaced by Josephson junctions. In this way, a device measuring the gradient is obtained that is superior to those previously known.

Figure 5:
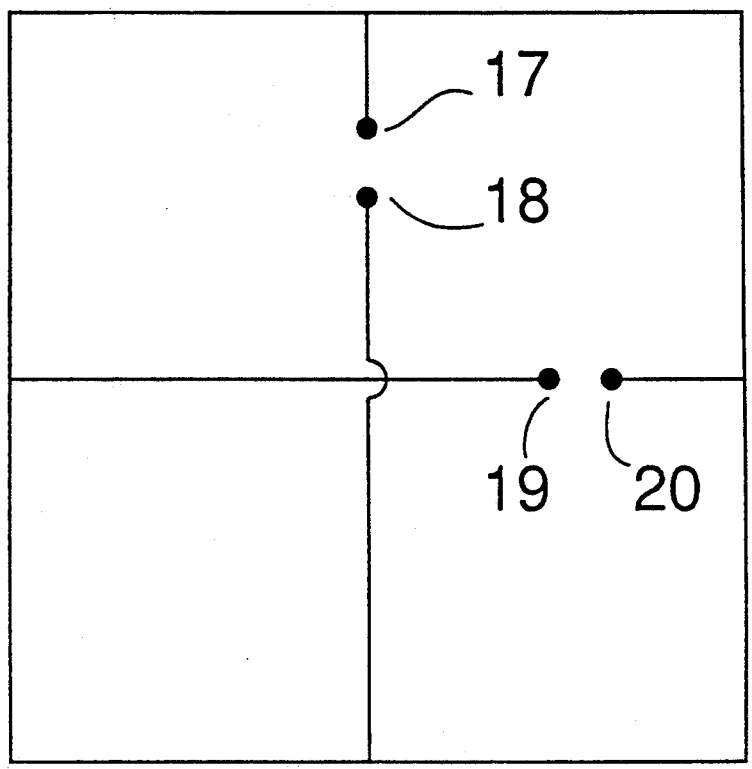
FIG. 5 depicts an alternative way of measuring two independent gradient components using only one pickup coil, realized in a more conventional fashion.

We have shown that several independent, mutually non-coupling current components flowing in one coil can be measured simultaneously; this idea can be applied to other types of coils than that described in FIG. 2 as well. FIG. 5 depicts an example of a coil based on the aforementioned principle, realized with conventional parallel connection of loops. Two independent gradients can be measured by connecting two current sensing elements (21), (22) between terminals (17) and (18) and between terminals (19) and (20). Here, a shielding current is induced in homogeneous fields; thus the coils described in FIGS. 2-4 are to be preferred.

We claim:

1. A pickup coil for simultaneously measuring at least two independent magnetic flux density components, including first or higher order gradients thereof, said pickup coil comprising a plurality of interconnected loops lying in a plane and at least two pairs of output terminals for connection to current sensing means, each of said pairs of output terminals comprising first and second terminals, each of said loops being connected to one of said first and second terminals of each of said pairs of output terminals, the winding direction of said loops relative to each other and the connection of said loops to the terminals of said pairs of output terminals being such that the presence of one magnetic flux density component at said pickup coil produces current conditions in said loops and at one of said pairs of output terminals causing current to flow into and out of only said one of said pairs of output terminals and through a current sensor connected thereto, and the presence of another magnetic flux density component at said pickup coil produces current conditions in said loops and at the other of said pairs of output terminals causing current to flow into and out of only said other of said pairs of output terminals and through a current sensor connected to said other of said pairs of output terminals.

2. A pickup coil according to claim 1 characterized in that each of the loops has been formed by connecting in parallel at least two subloops wound in the same direction.

3. A pickup coil according to claim 2 wherein each of said loops has a planar, generally square configuration, wherein each of said loops is divided into two adjacent, generally right triangular subloops of equal size connected in parallel, and wherein adjacent sides of said subloops lie at 45° angles with respect to a gradient component to be measured.

4. A pickup coil according to claim 2, characterized in that the current sensing means is an inductively coupled superconducting quantum interference device.

5. A pickup coil according to claim 2, characterized in that the coil is part of the superconducting quantum interference device.

6. A pickup coil according to claim 1 characterized in that the current sensing means is an inductively coupled superconducting quantum interference device.

7. A pickup coil according to claim 1 characterized in that the coil is part of the superconducting quantum interference device.

8. A pickup coil according to claim 1 wherein each of said loops has a planar, generally square configuration, wherein each of said loops is divided into two adjacent, generally right triangular subloops of equal size connected in parallel, and wherein adjacent sides of said subloops lie at 45° angles with respect to a gradient component to be measured.

9. A pickup coil according to claim 8, characterized in that the current sensing means is an inductively coupled superconducting quantum interference device.

10. A pickup coil according to claim 8, characterized in that the coil is part of the superconducting quantum interference device.

11. A pickup coil for measuring the first order gradient of magnetic flux density comprising:

four substantially planar loops (1, 2, 3, 4) of current conductors, said loops being positioned symmetrically about a central axis extending perpendicularly to the plane of the loops such that a first loop (1) is positioned adjacent a second loop (2) and a third loop (3), said second loop (2) is positioned adjacent said first loop (1) and a fourth loop (4), said fourth loop (4) is positioned adjacent said second loop (2) and said third loop (3), and said third loop (3) is positioned adjacent said fourth loop (4) and said first loop (1), said first and second loops being connected in series such that current flowing in said pickup coil flows in one direction around the first loop and in the opposite direction around the second loop, said third and fourth loops being connected in series such that current flowing in the pickup coil flows in one direction around the third loop and in the opposite direction around the fourth loop; and first and second terminals (5, 6) for connecting said pickup coil to current sensing means; the first and second series connected loops being connected in parallel with the third and fourth series connected loops across said first and second terminals, said first terminal (5) being located between said first and third loops and said second terminal (6) being located between said second and fourth loops, the connection of said loops to said terminals being such that current flows in the one direction in said first and third loops and in the opposite direction in said second and fourth loops.

12. A pickup coil according to claim 11 wherein each of the loops (1, 2, 3, 4) is formed by connecting in parallel at least two subloops wound in the same direction.

13. A pickup coil according to claim 12 further defined as one suitable for use with a current sensing device comprising an inductively coupled superconducting quantum interference device.

14. A pickup coil according to claim 12 wherein each of said loops has a generally square configuration, wherein each of said loops is divided into two adjacent, generally right triangular subloops of equal size connected in parallel (9, 10; 11, 12; 13, 14; 15, 16), and wherein adjacent sides of said subloops lie at 45° angles with respect to a gradient component to be measured.

15. A pickup coil according to claim 12 wherein said coil is further defined as forming part of a superconducting quantum interference device.

16. A pickup coil according to claim 11, characterized in that the current sensing means is an inductively coupled superconducting quantum interference device.

17. A pickup coil according to claim 11, characterized in that the coil is part of the superconducting quantum interference device.

18. A pickup coil according to claim 11 wherein said coil further includes third and fourth terminals (7, 8) for connecting said pickup coil to additional current sensing means, said third terminal (7) being connected intermediate said series connected first and second loops, and said fourth terminal (8) being connected intermediate said series connected third and fourth loops.

19. A pickup coil according to claim 11 wherein each of said loops has a planar, generally square configuration, wherein each of said loops is divided into two adjacent, generally right triangular subloops of equal size connected in parallel (9, 10; 11, 12; 13, 14; 15, 16), and wherein adjacent sides of said subloops lie at 45° angles with respect to a gradient component to be measured.

20. A pickup coil according to claim 19 further defined as one suitable for use with a current sensing device comprising an inductively coupled superconducting quantum interference device.

21. A pickup coil according to claim 19 wherein said coil is further defined as forming part of a superconducting quantum interference device.

* * * * *